United States Patent
Fuerle et al.

(10) Patent No.: US 6,760,260 B2
(45) Date of Patent: Jul. 6, 2004

(54) SEMICONDUCTOR MEMORY APPARATUS

(75) Inventors: Robert Fuerle, Neubiberg (DE); Eckehard Plättner, Oberhaching (DE); Manfred Plan, Munich (DE)

(73) Assignee: Infineon Technologies AG, Munich (DE)

( * ) Notice: Subject to any disclaimer, the term of this patent is extended or adjusted under 35 U.S.C. 154(b) by 34 days.

(21) Appl. No.: 10/269,834

(22) Filed: Oct. 11, 2002

(65) Prior Publication Data

US 2003/0086301 A1 May 8, 2003

(30) Foreign Application Priority Data

Oct. 12, 2001 (DE) .......................................... 101 50 498

(51) Int. Cl.[7] .............................................. G11C 16/04
(52) U.S. Cl. ............................ 365/189.02; 365/230.02; 365/205
(58) Field of Search ....................... 365/189.02, 230.02, 365/205, 189.01, 230.03, 204

(56) References Cited

U.S. PATENT DOCUMENTS 5,406,525 A * 4/1995 Nicholes ................. 365/230.02
5,666,319 A  9/1997 Okamura .................... 365/205

\* cited by examiner

*Primary Examiner*—David Lam
(74) *Attorney, Agent, or Firm*—Fish & Richardson, PC

(57) ABSTRACT

A semiconductor memory apparatus includes a memory cell array having a multiplicity of data lines and a multiplicity of local amplifiers, each of the local amplifiers being associated with a data line. An amplifier group includes at least two amplifiers selected from the multiplicity of local amplifiers. Each amplifier has at least a pair of selection transistors for selecting a particular amplifier from the amplifier group. The selection transistors have a common gate, an unshared intrinsic diffusion region, and a shared intrinsic diffusion region, the shared intrinsic diffusion region being shared with an adjacent selection transistor from an adjacent amplifier.

11 Claims, 2 Drawing Sheets

US 6,760,260 B2

SEMICONDUCTOR MEMORY APPARATUS

FIELD OF INVENTION

This invention relates to a semiconductor memory.

RELATED APPLICATIONS

This application claims the benefit of the Oct. 12, 2001 priority date of German application 101 50 498.5-53.

BACKGROUND

Note: signal and line designations "bar_xy" in the description and in the claims correspond to the signal designations "xy" with a horizontal line above them in the drawings.

Semiconductor memory apparatuses are known which comprise a multiplicity of memory cell arrays. Each memory cell array has an associated multiplicity of local sense amplifiers which receive, assess and amplify the data which are read from the memory cell array. The sense amplifiers are arranged in a sense amplifier row above or below the memory cell array. Each sense amplifier comprises, in addition to the actual amplifier device, a pair of selection transistors which allow one sense amplifier from a plurality of adjacent sense amplifiers to be selected to pass its information to a differential data transmission line. This allows, by way of example, a block of 32 sense amplifiers to be constructed which use 32 selection lines CSL (column select line) to forward their respective information to a common differential pair of data transmission lines LDQ, bar_LDQ. In this context, the respective signal A, B, C . . . is output to the line LDQ, and the inverse of the respective signal bar_A, bar_B, bar_C . . . is output to the line bar_LDQ.

FIG. 4 shows a basic sketch of selection transistors 1 for sense amplifiers based on the prior art. The two respective selection transistors 1 for a sense amplifier are respectively formed from two diffusion regions 2 and a common gate 3.

One selection transistor 1 for each sense amplifier is connected for signaling purposes to the data transmission line LDQ, and the other selection transistor 1 for each sense amplifier is connected for signaling purposes to the data transmission line bar_LDQ. The sense amplifier row containing selection transistors 1 is wider than the memory cell array itself, however, the result of which is that the available surface area on the semiconductor apparatus cannot be utilized in optimum fashion.

SUMMARY

It is thus an object of the present invention to provide a semiconductor memory apparatus which allows better use of the available resources.

This object is achieved by a semiconductor memory apparatus having the features specified in claim 1. Preferred embodiments are covered by the dependent claims.

The invention provides a semiconductor memory apparatus or memory chip or memory module, comprising:

at least one memory cell array having a multiplicity of data lines or bit lines,
a multiplicity of local amplifiers or local sense amplifiers for amplifying signals or data transmitted to and/or from the memory cell array, where the multiplicity of local amplifiers can be connected for signaling purposes to the multiplicity of data lines, each amplifier has precisely one uniquely associated data line, and at least two amplifiers and the associated data lines respectively form a group;
where each amplifier comprises at least two selection transistors for selecting an amplifier from a group of amplifiers,
where the at least two selection transistors for an amplifier respectively comprise two intrinsic diffusion regions and a common control electrode or gate, and
where adjacent selection transistors for adjacent amplifiers use a diffusion region jointly.

The fact that adjacent amplifiers use a respective diffusion region jointly means that the surface area needed for arranging the amplifiers can advantageously be reduced. This allows a more compact design for the semiconductor memory apparatus. In addition, the unique association between each data line and each amplifier allows an increased reading and writing speed to be achieved. Such amplifiers are also referred to as "dedicated amplifiers".

Preferably, the local amplifiers comprise sense amplifiers, "dedicated sense amplifiers", for amplifying data which are read from the memory cell array.

In one preferred embodiment, the semiconductor memory apparatus comprises at least one pair of data transmission lines, where each data transmission line in a pair of data transmission lines can respectively be connected for signaling purposes to all the amplifiers in a group. This allows the number of data transmission lines needed to be advantageously reduced.

Preferably, the selection transistors using a common diffusion region use a connecting line for the respective data transmission line jointly. This allows the available surface area to be utilized even more advantageously, since only approximately half the number of connecting lines are now needed as compared with the conventional case.

In addition, preferably, one data transmission line in a pair of data transmission lines is used to transmit the respective signal to be transmitted, and the other data transmission line in the pair of data transmission lines is used to transmit the inverse of the respective signal to be transmitted.

In one preferred embodiment, the semiconductor memory device also comprises a multiplex device for sequentially transmitting data from the data lines in a group. This allows error-free transmission of the data from and to the semiconductor memory apparatus to be reliably ensured. Preferably, the multiplex device comprises a multiplicity of selection lines, with each data line having an associated selection line.

Preferably, 32 amplifiers and the associated data lines form a group.

With further preference, at least one memory cell array comprises 1024 data lines.

Preferably, the semiconductor memory apparatus comprises 64 memory cell arrays.

In one preferred embodiment, the semiconductor memory apparatus comprises an address allocation device for allocating internal addresses to external addresses in a memory cell array. This allows an internal addressing order which is altered in the memory cell array to be adjusted or scrambled such that it does not appear externally.

Other objects, features and advantages of the present invention will become obvious from a detailed description of the present invention with reference to the accompanying drawings, in which:

DESCRIPTIONS OF THE DRAWINGS

DETAILED DESCRIPTION

Figure 1:
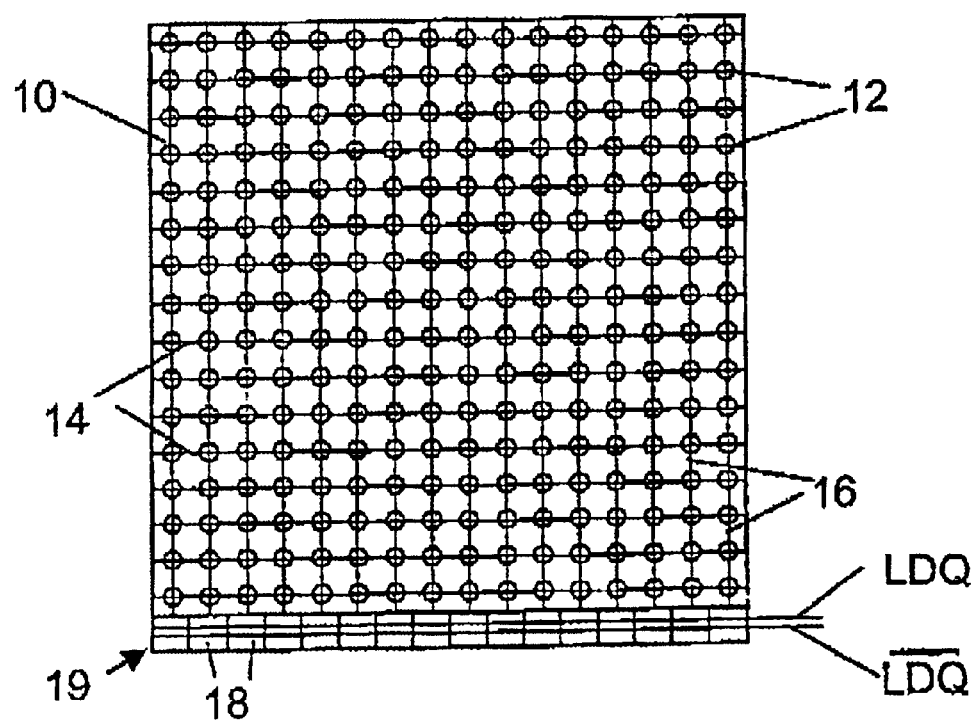
FIG. 1 shows a schematic view of part of a semiconductor memory apparatus.

FIG. 1 shows a schematic view of part of a semiconductor memory apparatus. A memory cell array 10 comprises a multiplicity of memory cells 12 which are arranged, at least in regions, in the manner of a matrix and which are connected to word lines 14 running horizontally in FIG. 1 and to data or bit lines 16 running vertically in FIG. 1.

Information or data read from the memory cells 12 via the data lines 16 are received, assessed and amplified for external forwarding by local amplifiers 18. In this context, each amplifier 18 is or can be connected, preferably uniquely, for signaling purposes to a data line 16 ("dedicated amplifiers"). Preferably, the amplifiers 18 are arranged in a row 19 below or above the memory cell array 10. In the present preferred embodiment, the amplifiers 18 are in the form of local sense amplifiers or dedicated local sense amplifiers. However, it is likewise conceivable for the amplifiers to be in the form of record amplifiers.

Figure 2:
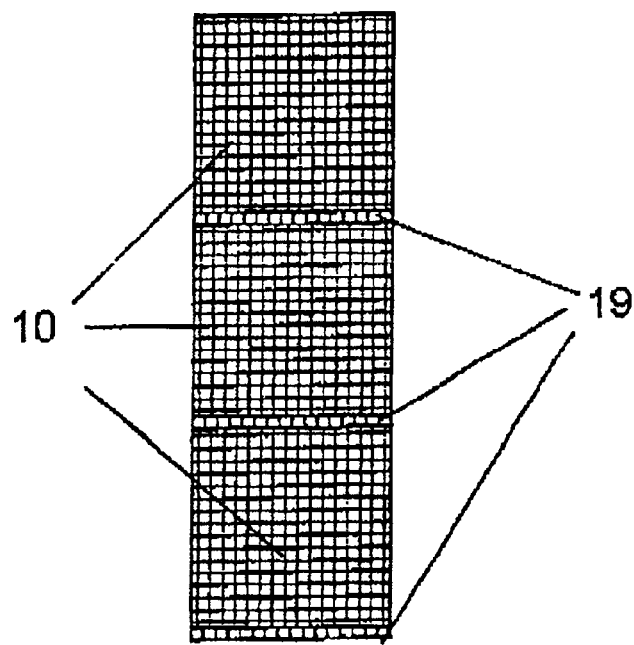
FIG. 2 shows a further schematic view of part of a semiconductor memory apparatus.

FIG. 2 shows a schematic view in which a plurality of memory cell arrays 10 with the corresponding rows 19 of amplifiers 18 are arranged. Preferably, 64 memory cell arrays 10 with the associated amplifier rows 19 are arranged above one another in the vertical direction in FIG. 2.

Preferably, 32 data lines 16 and the associated amplifiers 18 are respectively combined to form a group. However, it is likewise conceivable for a different number of data lines 16 to be combined to form a respective group. All the data lines 16 in a group are or can be connected for signaling purposes to a differential pair of data transmission lines LDQ, bar_LDQ via the respective amplifiers 18. In this context, one data transmission line LDQ is used to transmit the signal itself, and the other data transmission line bar_LDQ is used to transmit the inverse of the signal. FIGS. 1 and 2 show only one group of amplifiers 18 and only one differential pair of data transmission lines LDQ, bar_LDQ. If a plurality of groups G of amplifiers 18 are provided, then a plurality of pairs of data transmission lines LDQ, bar_LDQ are likewise provided.

Figure 3:
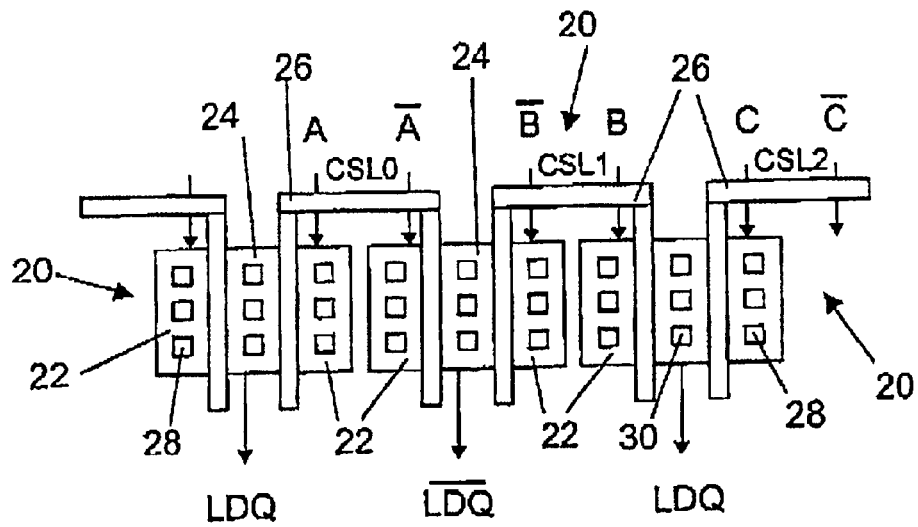
FIG. 3 shows a schematic view of selection transistors based on a preferred embodiment of the invention.
Figure 4:
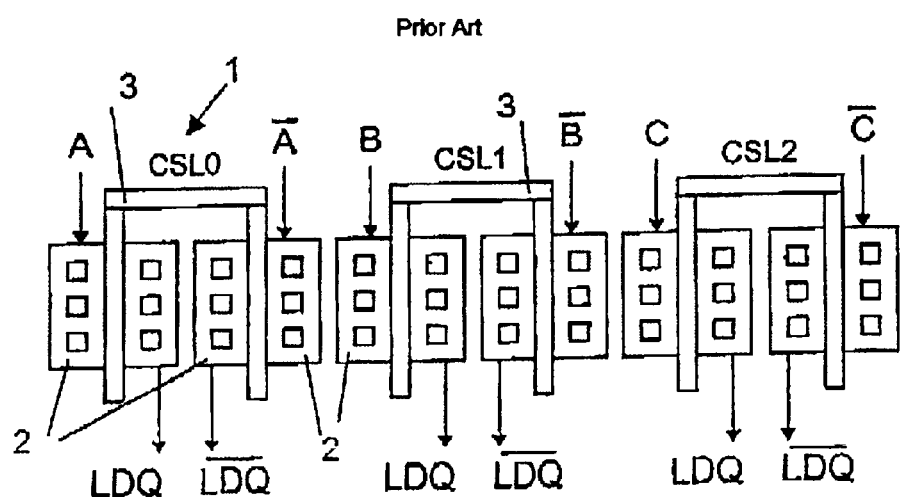
FIG. 4 shows a schematic view of selection transistors based on the prior art.

In addition to the actual amplifier device, the amplifiers 18 also comprise a respective pair of selection transistors 20, which are described below in detail with reference to FIG. 3.

Each selection transistor 20 in a pair of selection transistors 20 comprises two respective diffusion regions 22, 24. The two selection transistors 20 in a pair of selection transistors 20 share a common gate or common control electrode 26. The selection transistors 20 are connected to the appropriate data transmission line LDQ, bar_LDQ via diffusion connection contacts 28, 30, preferably without further transistors connected in between. Preferably, a plurality of diffusion connection contacts 28, 30 are provided for each selection transistor 20 in order to make redundancies available. Since all the amplifiers 18 are or can be connected for signaling purposes to the same data transmission lines LDQ and bar_LDQ via selection transistors 20, the respective selection transistors 20 are thus electrically connected to one another by means of the data transmission lines LDQ and bar_LDQ.

In addition, two respective adjacent selection transistors 20 belonging to different pairs of selection transistors 20 have a common diffusion region 24, i.e. a respective diffusion region in each transistor 20 is merged with a diffusion region in the adjacent transistor 20 to form a common diffusion region 24. Adjacent selection transistors 20 for adjacent amplifiers 18 thus share a respective diffusion region 24. The merging of a respective diffusion region 24 in adjacent selection transistors 20 is also referred to as "merged diffusion". The second diffusion region 22 in each selection transistor 20 is respectively used only by the respective selection transistor 20 alone.

Preferably, the adjacent transistors 20 with a common diffusion region 24 have at least one respective common diffusion connection contact 30 for the respective data transmission line LDQ, bar_LDQ. Preferably, all the diffusion connection contacts 30 for the jointly used diffusion region 24 are used jointly.

In this context, an addressing order for the signals A, B, C . . . and bar_A, bar_B, bar_C . . . is obtained which has altered from the prior art. This altered addressing order can be compensated for, however, by means of suitable address distribution, "address scrambling", using an address allocation device, so that the alteration in the addressing order preferably does not appear externally.

The arrangement described above is preferably used in each case for selection transistors 20 within a group of amplifiers 18. However, provision can likewise be made for all the selection transistors 20 in a memory cell array 10 to be designed in such a way.

The merging of diffusion regions 24 in selection transistors for adjacent amplifiers 18 can reduce the width of the amplifier row 19. Consequently, the distance between the amplifier row 19 and the associated memory cell array 10 can be reduced, which results in a space saving in the vertical direction in FIG. 1. The reason for this space saving in the vertical direction is explained below.

Connecting lines which connect the memory cell array 10 to the amplifier row 19 can generally be arranged only at angles of 45° or 90° with respect to the memory cell array 10 or the amplifier row 19. If the amplifier row 19 is wider than the memory cell array 10, a few of the connecting lines need to be produced at a very great angle, i.e. the length to be bridged in the lateral direction is relatively great. This and the fact that the connecting lines can be arranged only at angles of 45° or 90° result in the distance between the memory cell array 10 and the amplifier row 19 needing to be made relatively great. By contrast, in the present invention, the number and length of connecting lines at an angle can be reduced, which means that the distance between the memory cell array 10 and the amplifier row 19 can be reduced. In the embodiment which is preferred in the present case, it is possible to achieve a reduction in the distance of up to 2 $\mu$m per memory cell array 10 with an associated amplifier row 19. As already mentioned above, 64 memory cell arrays 10 are preferably arranged above one another, which results in a space saving of 128 $\mu$m in the vertical direction in FIG. 2.

The operation of the semiconductor memory apparatus based on a preferred embodiment of the present invention is described below with reference to FIGS. 1 and 3.

Selection lines CSLn (column select line), n=0, 1, 2, . . . , are used to select a respective data line 18 for transmitting data to and from the differential pair of data transmission lines LDQ, bar_LDQ. In this context, n in CSLn represents that data line 18 which has just been selected.

The respective signal is received, assessed and amplified for forwarding in the corresponding amplifier 18. The selection transistors 20 for the corresponding amplifier 18 are switched such that the signal can be passed from the amplifier 18 to the pair of data transmission lines LDQ, bar_LDQ. Within a group, the signals are multiplexed using a multiplex device, which results in just one respective signal or signal pair in a group being able to be passed to the pair of data transmission lines LDQ, bar_LDQ at any time. Consequently, it is possible for adjacent selection transistors 20 for adjacent amplifiers 18 to share a diffusion region 24, since adjacent signals are never passed to the pair of data transmission lines LDQ, bar_LDQ at the same time.

The arrangement described above is preferably used in static semiconductor memories, "SRAMs", or in dynamic semiconductor memories, "DRAMs".

Having described the invention, and a preferred embodiment thereof, what we claim as a new and secured by Letter Patent is:

What is claimed is:

1. A semiconductor memory apparatus comprising:
   a memory cell array having a multiplicity of data lines;
   a multiplicity of local amplifiers, each of the local amplifiers being associated with a data line;
   an amplifier group that includes at least two amplifiers selected from the multiplicity of local amplifiers, each of the amplifiers including
      at least two selection transistors for selecting a particular amplifier from the amplifier group, the two selection transistors having
         a common gate,
         an unshared intrinsic diffusion region, and
         a shared intrinsic diffusion region, the shared intrinsic diffusion region being shared with an adjacent selection transistor from an adjacent amplifier.

2. The semiconductor memory apparatus of claim 1, wherein the local amplifiers comprise sense amplifiers for amplifying data read from the memory cell array.

3. The semiconductor memory apparatus of claim 1, further comprising first and second data transmission lines, each of which is connectable to all amplifiers in the amplifier group.

4. The semiconductor memory apparatus of claim 3, further comprising an electrical connection between one of the first and second data transmission lines and the shared intrinsic diffusion region.

5. The semiconductor memory apparatus of claim 3, wherein the first data transmission line is configured to carry a signal that is the inverse of a signal carried by the second data transmission line.

6. The semiconductor memory apparatus of claim 1, further comprising a multiplexer for sequentially transmitting data from the data lines associated with the amplifiers in an amplifier group.

7. The semiconductor memory apparatus of claim 6, wherein the multiplexer comprises a multiplicity of selection lines, each of which is associated with a data line.

8. The semiconductor memory apparatus of claim 1, wherein an amplifier group comprises thirty-two amplifiers and their associated data lines.

9. The semiconductor memory apparatus of claim 1, wherein the memory cell array comprises 1024 data lines.

10. The semiconductor memory apparatus of claim 1, comprising sixty-four memory cell arrays.

11. The semiconductor memory apparatus of claim 1, further comprising an address allocation device for allocating internal addresses to external addresses in the memory cell array.

* * * * *